United States Patent [19]

Hasenbalg

[11] Patent Number: 4,682,695
[45] Date of Patent: Jul. 28, 1987

[54] AUTOMATED KEYBOARD TESTING

[76] Inventor: Ralph D. Hasenbalg, 8635 Rudnick Ave., Canoga Park, Calif. 91304

[21] Appl. No.: 595,435

[22] Filed: Mar. 30, 1984

[51] Int. Cl.$^4$ .............................................. B07C 5/344
[52] U.S. Cl. .................................... 209/571; 198/345; 198/372; 198/598; 209/651; 209/925
[58] Field of Search ............... 209/509, 539, 552, 563, 209/564, 571, 573, 606, 651–654, 903, 914, 922, 925; 198/345, 486, 367, 372, 598; 294/104; 324/73 AT; 364/481, 506, 507, 580; 414/226; 400/180

[56] References Cited

U.S. PATENT DOCUMENTS

| | | | |
|---|---|---|---|
| 3,189,177 | 6/1965 | Mays et al. | 209/606 X |
| 3,213,997 | 10/1965 | Fryer | 198/345 X |
| 3,268,094 | 8/1966 | Fischer et al. | 414/226 |
| 3,303,923 | 2/1967 | Davis | 209/606 X |
| 3,386,575 | 6/1968 | Quinn | 209/564 X |
| 3,608,713 | 9/1971 | Crosby et al. | 209/606 X |
| 3,785,195 | 1/1974 | Yasuhiro et al. | 198/345 X |
| 3,811,548 | 5/1974 | Neff | 198/345 |
| 3,983,988 | 10/1976 | Maxted et al. | 198/367 X |
| 4,348,276 | 9/1982 | Tateishi et al. | 209/573 |

*Primary Examiner*—Robert B. Reeves
*Assistant Examiner*—Edward M. Wacyra
*Attorney, Agent, or Firm*—Sheldon & Mak

[57] ABSTRACT

A conveyor system transports keyboards for automatic testing by a keyboard testing mechanism located at a test station, and a discharge conveyor accepts rejected keyboards. At the testing station the keyboard and the keyboard testing mechanism are brought into a testing relationship (where the keyboards and test mechanism are located physically closer and in electrical contact); they are thereafter removed from that relationship. On the main conveyor there is a separation element for effecting a right-angular turn of rejected keyboards from the normal conveyance direction for the passed keyboards.

21 Claims, 10 Drawing Figures

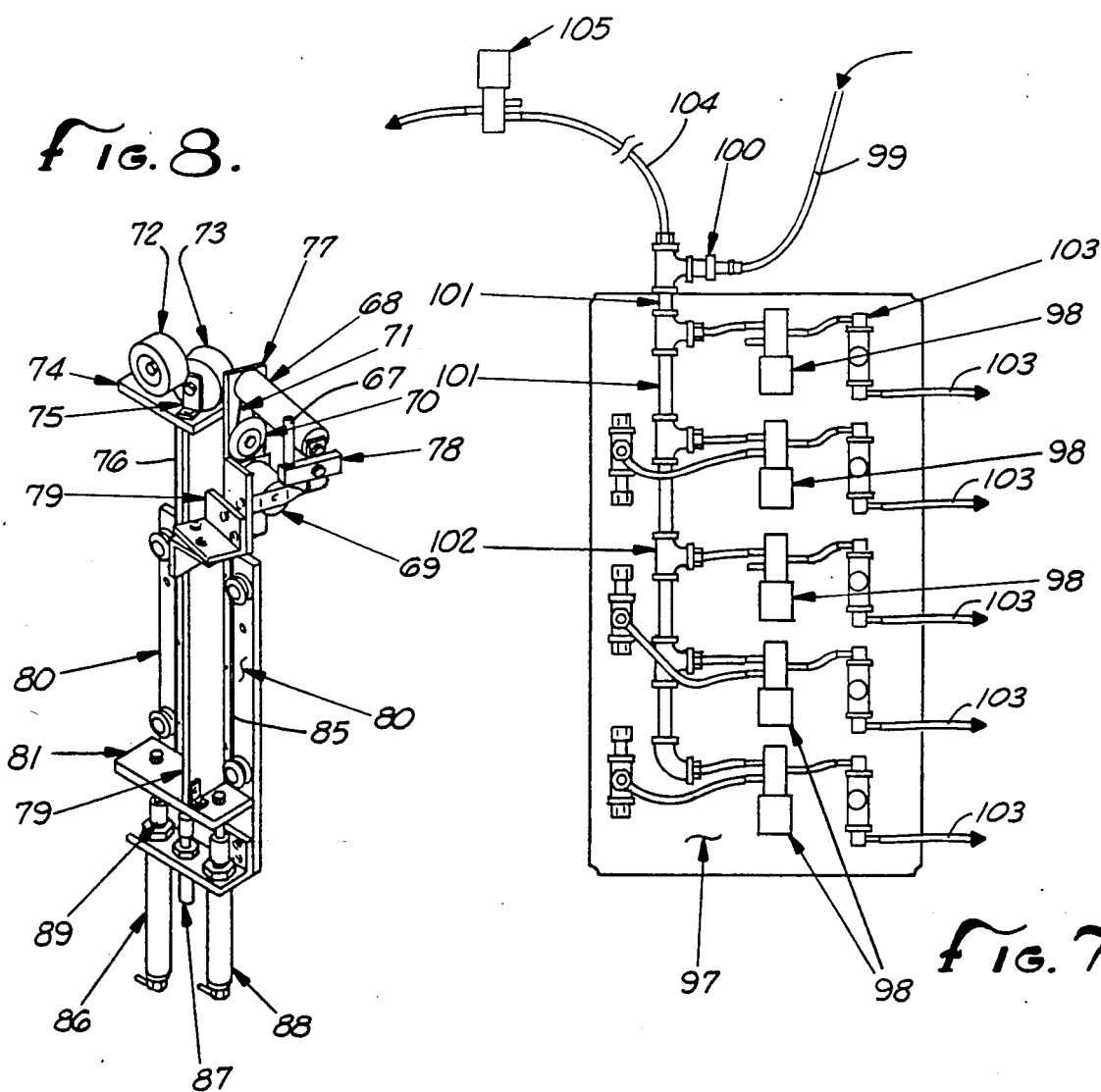
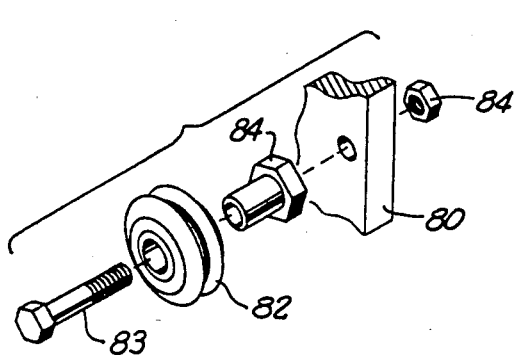
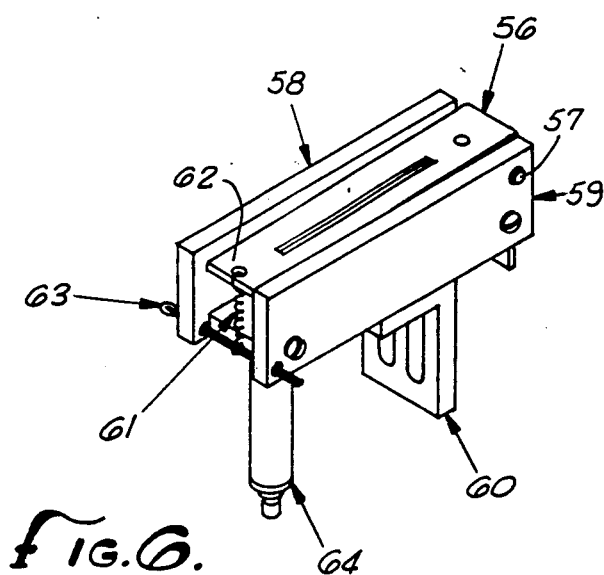

AUTOMATED KEYBOARD TESTING

BACKGROUND OF THE INVENTION

This invention relates to the automatic testing of keyboards by a keyboard testing mechanism. In particular, it relates to a conveyor system for transporting keyboards to the testing mechanism and for thereafter discharging the keyboards.

Testing of keyboards by a keyboard test mechanism manually and separably is known by mechanisms described in the applicant's co-pending patent application, U.S. Ser. No. 310,850, now U.S. Pat. No. 4,441,833, and U.S. Ser. No. 556,836 issued as U.S. Pat. No. 4,543,000, the contents whereof are incorporated by reference herein.

In the test mechanisms of the earlier patent applications keyboards are brought manually into position with the keyboard test mechanism and thereafter the keyboard test mechanism undergoes a programmed set of steps whereby the keys of the board are tested for effective operation. As this is a manual operation it is relatively time-consuming to bring each keyboard in proper relationship with the test mechanism, and thereafter to disconnect manually the keyboard from the keyboard test mechanism and remove it either to a passed location or a reject location.

There is accordingly a need to provide a keyboard test mechanism wherein the testing operation can be automated for high-speed testing. In the applicant's knowledge there exists no system to fulfill this requirement.

It is furthermore desirable to provide in an automated system a method of smoothly and effectively separating keyboards in two directions, namely, between a passed direction and a reject direction. Given that keyboards are relatively sensitive mechanisms this transfer has to be effected smoothly, and once again the Applicant is unaware of any conveyance system for keyboards or other articles wherein conveyed articles can be branched in two directions, for instance in a right-angular relationship, smoothly and effectively.

SUMMARY OF THE INVENTION

A conveyor system for transporting keyboards for automatic testing by a keyboard test mechanism comprises a feed conveyor means for moving keyboards to a test station where the keyboards can be tested. The keyboard test mechanism is located at the station where there is means for bringing the keyboard and keyboard test mechanism into a testing relationship, the mechanism and keyboard being brought into physical engagement and electrical continuity. After testing, the relationship is removed and the keyboard is returned to the conveyor means. On a discharge conveyor means rejected keyboards are separated from passed keyboards.

On the discharge conveyor system there is separation apparatus which includes lifting means physically locatable in at least three different positions: in the first position below the conveyor level, in the second position, where elements travelling on the conveyor system, can be stopped and in the third position to lift elements on the conveyor above the conveying level and direct the element in a direction different from the normal conveyor direction.

At the keyboard test mechanism there is a removable gripper mechanism physically movable between discrete different heights and adapted to support the keyboard at the test station and effect and remove the keyboard test mechanism and keyboard relative to its testing relationship.

BRIEF DESCRIPTION OF THE DRAWINGS

FIG. 6 is a perspective view of stop means for stopping travel of the keyboard by frictional engagement adjacent the keyboard side.

FIG. 7 is a diagrammatic view illustrating the manifold whereby pneumatic pressure is distributed to the various mechanisms for effecting testing, removal from testing and rejection of keyboards from the conveyor system.

FIG. 8 is a perspective view of separation apparatus whereby keyboards are removed on the discharge conveyor in a first direction away from the normal direction of travel.

FIG. 9 is a perspective view showing a bearing system whereby the separation means can be moved vertically between discrete positions.

DETAILED DESCRIPTION OF THE DRAWINGS

Figure 1:
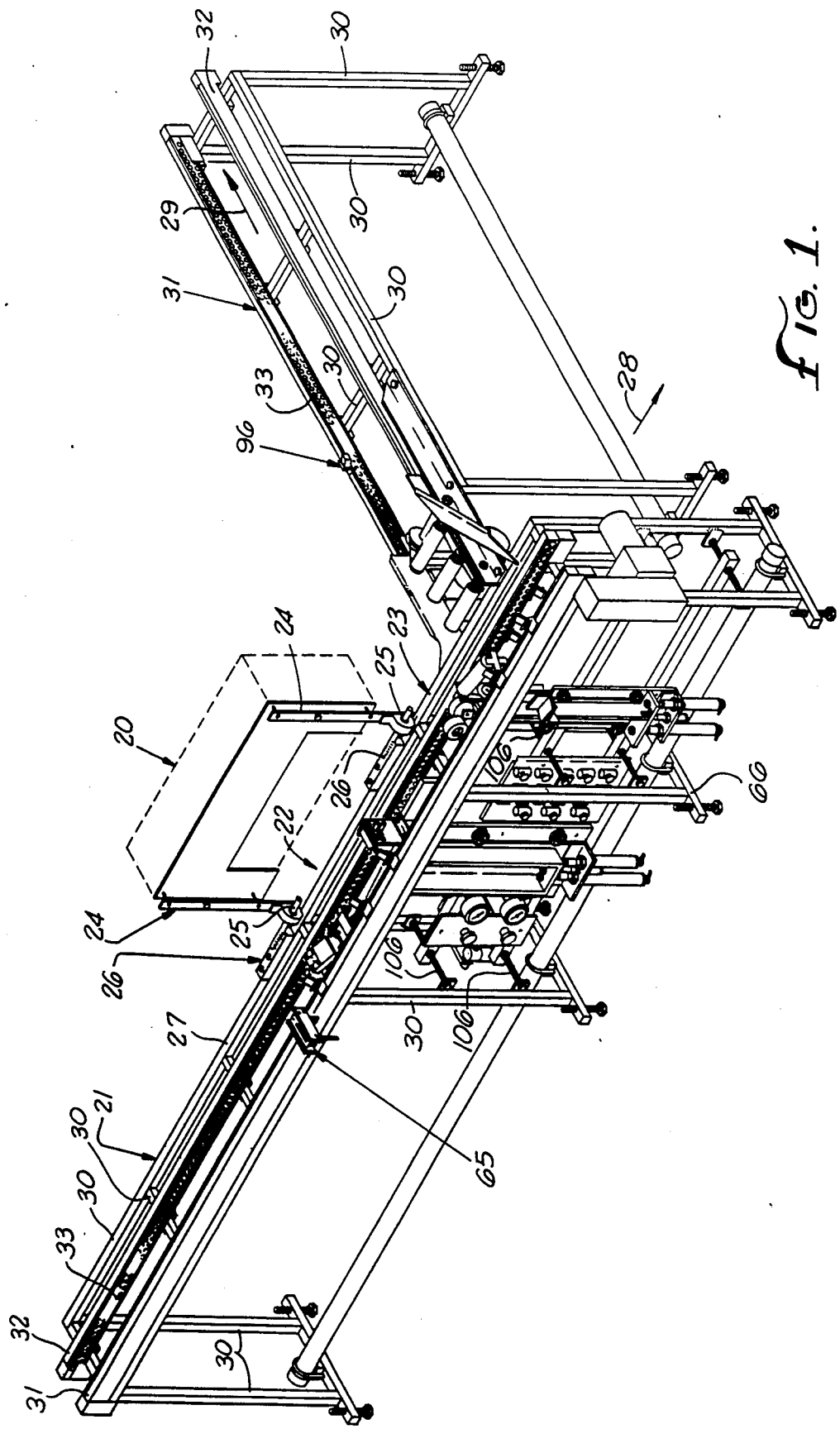
FIG. 1 is a perspective view showing a conveyor system for transporting keyboards for automatic testing by keyboard testing mechanism, and illustrating a feed conveyor and discharge conveyor.
Figure 4:
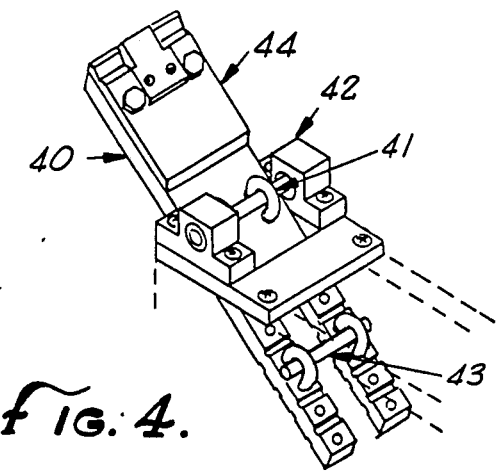
FIG. 4 is a perspective view showing pivoted abutting means at the trailing end of the gripper mechanism for positively gripping a keyboard at the test station.
Figure 5:
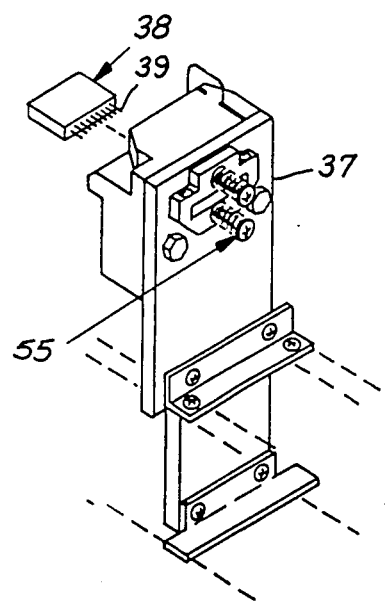
FIG. 5 is a perspective view of barrier means at the downstream side of the movable gripper means against which a keyboard can positively engage.

A conveyor system for transporting keyboards for automatic testing by a keyboard test mechanism 20 comprises a feed conveyor 21 for moving keyboards to a test station 22 where the keyboard can be tested. The keyboard test mechanism 20 is located at the test station and downstream of the test station there is a discharge conveyor means 23 whereby keyboards rejected by the keyboard test mechanism can be separated from those passed by the keyboard test mechanism 20.

At the keyboard test station 22 the keyboard testing mechanism 20 is mounted on an arm 24 for pivotal movement about shaft 25 which is anchored to support structure 26 affixed to the framework 27 of the conveyor system.

The conveyor system includes structure permitting keyboards to travel in two directions: a normal direction 28 for passed keyboards and a direction 29 at right angles to the normal direction for rejected keyboards. The conveyor system is formed of a rectangular foundation structure and framework 30 which forms a table and bed on which keyboards can travel. The conveyor transport system is defined by two spaced sprocket-and-chain mechanisms 31 and 32, respectively. The mechanism 32 is laterally movable thereby to accommodate keyboards of different widths travelling on the system. The lateral adjustment is provided on the transversely extending squared tube structures 30 on which the chain-and-sprocket mechanisms 32 rests. The chain and sprocket structure is diagrammatically illustrated by numeral 33.

Figure 2:
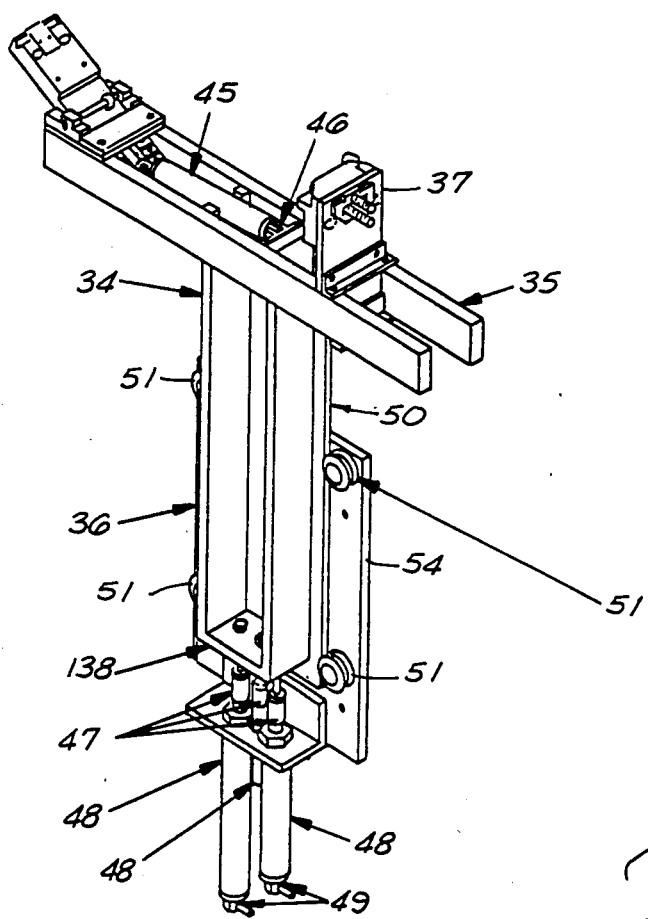
FIG. 2 is a perspective view showing a movable gripper mechanism for supporting a keyboard at a test station.
Figure 3:
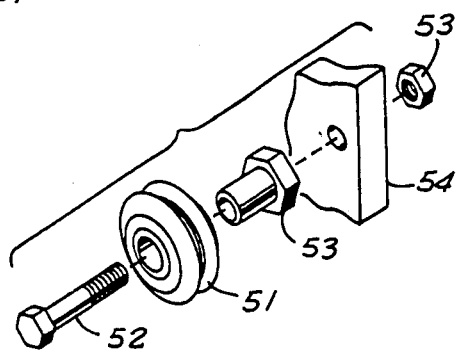
FIG. 3 is a partial perspective view showing a bearing mechanism on which the movable gripper mechanism can move vertically as required for testing.
Figure 10:
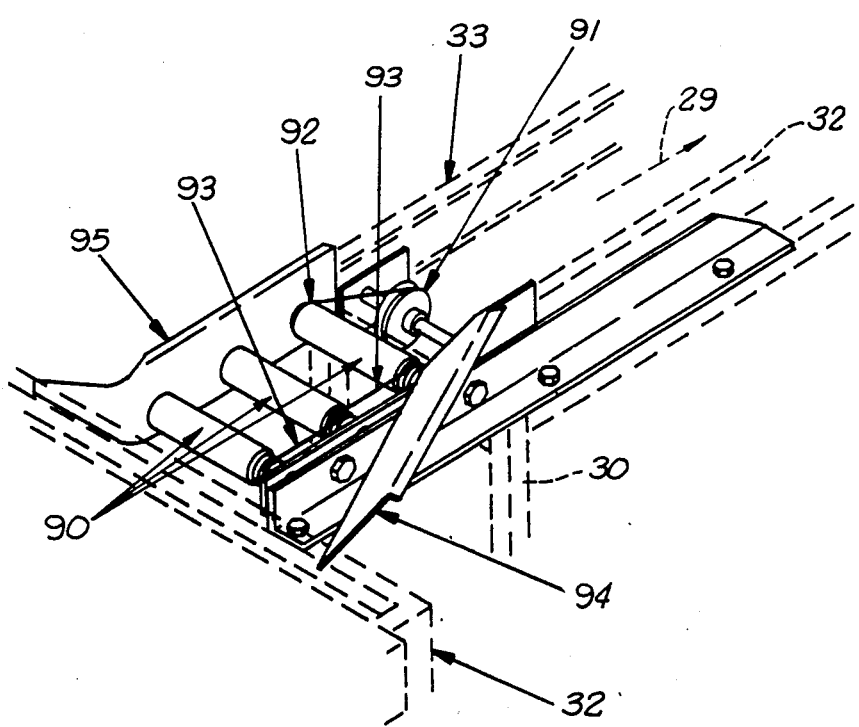
FIG. 10 is a perspective view showing discharge conveyor means and the feed rollers for moving keyboards in a first direction at right angles to the normal conveyor direction.

At the test station 22 there is a movable gripper mechanism illustrated in FIG. 2 which is movable between discrete different heights and is adapted to support the keyboard at the test station 22. At a first height keyboards can travel at the conveyance level on the conveyance transport unhindered by the gripper mechanism, at a second raised level keyboards are stopped and secured by the gripper mechanism for testing, and at a higher third level the keyboards are raised for testing by the keyboard test mechanism 20.

The gripper means includes a substantially T-piece structure 34 with a cross-limb 35 and a vertically directed main limb 36. The cross-limb of the T-piece is substantially horizontally located and at its leading end there is a barrier means 37 which is located downstream the conveyor system and against which a keyboard can physically abut and through which electrical contact is established with the keyboard test mechanism. The electrical output terminals from the keyboard are illustrated by block 38 with pins 39 which engage in mating sockets in the face of the barrier means 37. At the trailing position of the cross-limb 35 there is a pivoted abutting means 40 which is located upstream of the conveyor system and which is movable about a pivotal shaft 41 anchored in supports 42 and movable between a retractable position over which a keyboard can proceed and an extended position positively urging the keyboard forwardly against the barrier means 37 at the leading end of the cross-limb 35. Driving of the abutting means 40 is effected through a bar 43 connected to the limb of the abutting means remote from the operative limb 44 and to which bar 43 there is connected the drive shaft of a pneumatic cylinder 45 whereby the abutting means 40 is driven between its different positions. The opposite end of the cylinder 45 is affixed to an anchor means 46 on the cross-limb 35.

The main limb 36 of the T-piece 34 is constituted by a box-type structure within which is carried the pneumatic connection for cylinder 45, and at the foot 138 of the box-type structure there are connections 47 to the drive pistons 48 for permitting movement of the T-piece 34 vertically as activated through the connectors 47 and driven through the pneumatic tubes 49. The box-like structure of the main limb has a base plate 50, the edges of which are guided on roller mechanisms 51 which are mounted by bolt 52 and nut formations 53 to a foundation plate 54.

The barrier means 37 provides at its leading position opposite that side which connects with the keyboard 38, screws 55 to align and carry springs for the self aligning connector.

The gripper mechanism 34 constructed in this manner can easily be withdrawn from between the two chain-and-sprocket links 31 and 32 of the conveyor system by its removal upwardly. In this fashion gripper mechanisms having different dimensions: for instance, spaces between the barrier 37 and the abutting means 40 can be provided so that keyboards of different length can be tested at the test station 22 by the keyboard test mechanism 20.

As keyboards approach the test station 22 along the conveyor transport between the chain sprockets 31 and 32 they are stopped while waiting to enter the test station. A stop mechanism 65 is located upstream of the keyboard test station 22 and provides a pivoted L-shaped limb 56 mounted about a shaft 57 between two plates 58 and 59, the longer limb of the L being essentially horizontally located and the shorter limb being vertically located. The two sidewalls 58 and 59 are mounted on a support base 60 and the free end of the long limb of the L is connected with a spring mechanism 61 between its free end 62 and a split pin 63, the spring 61 urging the long limb of the L downwardly and the short limb upwardly into the conveyor part. Also mounted below the long limb of the L is a pneumatic cylinder 64 which in normal operation urges the top limb of the L upwardly so that the short limb is substantially vertically disposed with the conveyor path. Where the keyboards are to be stopped on the conveyor transport system the pneumatic cylinder is deactivated thereby permitting the short limb of the L to protrude at an angle into the conveyor path and thereby abut frictionally against the keyboard side thereby to effect a stopping action. The stopping means is shown upstream of the test station 22 on the fixedly located chain-and-sprocket limb 31 of the conveyor system.

On the discharge conveyer 23, passed and rejected keyboards are separated by separation apparatus 66. The separation apparatus includes rejection means with lifting means physically locatable in at least three different positions: a first position below the conveyor level as defined between the chain and sprocket limbs 31 and 32, commonly a second position for stopping the keyboard travel along the conveyor discharge means 23, and a third position to lift the keyboard above the conveying level and direct the keyboard in a first direction 29 on the discharge conveyor means at right angles to the normal discharge conveyor.

The rejection means includes roller means 67 substantially vertically disposed in the conveying part, the roller means being substantially running on a vertical shaft. There is also a substantially horizontally located roller 68 obliquely positioned relative to the direction of travel 28 for passed keyboard along the conveyor means. The horizontal roller is operable by a motor 69 which drives through a pulley wheel 70 and pulley belt 71.

There is also a wheel stabilizer means located by two wheels 72 and 73 upstream of the roller means and the vertical free-running roller 67. The wheel pair 72 and 73 act to stabilize the keyboard during a direction change to the first direction 29 onto the laterally directed conveyor. The wheel means 72 and 73 are polyurethane rollers, and at an appropriate angle relative to each other. The two rollers are respectively mounted on a plate 74 through a support structure 75 on top of a vertical pillar 76. The support plate 74 is adjacently located to a vertical pillar 77 which acts to support the one side of roller 68, the other side being supported by a structure 78. The pillar 76 forms part of an elongated limb structure 79 mounted on a base plate 80 and having a foundation plate 81. The base plate 80 locates bearing members 82 through bolt 83 and nut means 84 so that a vertical plate 85 can ride vertically upward and downwardly in response to pneumatic cylinders 86 and 88 mounted below the foundation plate 81 and connected through connection means 89 to activate upwardly and downwardly the support structure 79. Through the cylinder mechanisms 86 and 88 the rejection means can be located in at least the three different positions. Hydraulic damper 87 cushions the return of the moving assembly to the bottom position.

The lateral conveyor includes three horizontal feed rollers 90 driven by a drive pulley wheel 91 and pulley belts 92, 93. These rollers are operated by the same motor as operates the reject conveyor to take rejected keyboards in the first direction 29 laterally at right angles to the main conveyor direction. At the juncture of the two conveyors there is also a guide plate structure 94 and 95 which ensures that keyboards do not overrun the discharge conveyor during the change in direction.

Located strategically on the discharge conveyor downstream from the separation means is an optical sensor 96 which determines conveyor travel along the discharge conveyor. Any backing-up of rejected keyboards is determined by the optical sensor, which causes the computer system, to stop testing if the reject conveyor is full.

The pneumatic control of the various cylinders of the gripper mechanism, and separation mechanism is effected from a mechanical panel 97 on which there is mounted a series of valves 98 for receiving air pressure at 60 psi from a regulator along input line 99 which is in turn fed to a T-piece 100 to an input pipe 101 and through subsequent branches 102 to the valves 98. Output from the valves 98 can in turn activate flow control regulators 103 for the various lift mechanisms of the gripper mechanism, the abutting mechanism of the gripping mechanism, and the cylinders of the separation mechanism through outlet 103.

From the T-piece 100 there is an outlet pipe 104 to a regulator 105 to operate the stop 65 on the conveyor feed to the test station 22.

In operation of the conveyor system, keyboards feed along the feed conveyor between the input sprocket-and-chain limbs 31 and 32 to the test station 22. As determined by a computer control system keyboards only enter the test station 22 as desired and as the stop mechanism 65 which frictionally abuts the sides of the keyboards permit. The stop mechanism 65 operates to stop keyboards. When the keyboard is in the test station 22 gripper mechanism rises to the conveyance level such that barrier means 37 engage the leading edge of the keyboard, and the abutting arm 40 is activated to urge the keyboard into positive testing relationship with the gripper mechanism. The gripper mechanism is thereafter activated once again to raise the keyboard into an engaging position with the key test mechanism 20. The keyboard test mechanism 20 is in a position horizontally located above the conveyor, having been moved on shafts 25 downwardly to rest on the top of the conveyance limbs 31 and 32.

After a testing sequence as determined by computer control the keyboard test mechanism 20 completes testing of the keyboard in position at the test station. Thereafter the gripper mechanism acts to remove the keyboard from its test relationship, with the abutting means pivoting out of the way, and the keyboard being released from the positive physical and electrical engagement with the barrier means 37. The conveyor sprocket-and-chain system 31 and 32 then moves the keyboard onto the separation means on the discharge conveyor.

Depending upon whether the keyboard is to be passed or rejected the separation means either remains below the conveyance level or is raised to that level. When located below the conveyance level the keyboard continues in its normal direction 28. When the computer control as signaled by a rejection signal from the computer test mechanism activates the separation means it rises to the conveyance level such that the oblique roller 68 can engage the keyboard. Firstly, the keyboard engages the vertical roller 67 to stop the keyboard motion. The separation mechanism then raises the keyboard above the conveyance level. Driving the oblique roller 68 then causes the keyboard to turn onto the laterally disposed conveyor. During that turn the wheel means 72 and 73 stabilizes the keyboard. After turning the keyboard onto the lateral conveyor the feed rollers 90 continue to drive the keyboard down in the first direction 29 on the rejection discharge conveyor. Appropriately, keyboards along the rejection conveyor can be held up for time intervals as necessary so that material printed by a computer control system identifying rejected keyboards with rejection characteristics can then be identified together and the rejection characteristics as printed out from the computer control can be physically affixed to reject keyboards which are then recycled for correction.

The gripper mechanism can be physically adjusted in its position relative to the sprocket means 31 and 32 as can the separation mechanism by means of nuts on threaded rods 106 located below the conveyance level. This facilitates adjustment of the gripper mechanism position for keyboards of different size. The gripper mechanism can be vertically removed from the conveyance means and the conveyance means adjusted to accommodate different keyboards travelling on the conveyor.

Although the invention has been described with reference to conveyance of keyboards, it is clear that the separation mechanism for effecting a turn of conveyed elements can be used for elements other than keyboards. The separation means is a neat and effective means for effecting a 90-degree turn where appropriate and necessary for articles being on an automated conveyance.

While alternative embodiments of the present invention have been illustrated and described, it will be apparent to those skilled in the art that many variations and modifications may be made without departing from the teachings herein, and it is intended that all such variations and modification be encompassed within the scope of the appended claims.

I claim:

1. A conveyor system for transporting keyboards for automatic testing by a keyboard testing mechanism comprising feed conveyor means for moving keyboards to a test station where the keyboard can be tested, the keyboard testing mechanism being located at said test station, discharge conveyor means whereby keyboards passed by the keyboard test mechanism are distinquished from keyboards rejected by the keyboard test mechanism, means at said testing station for bringing the keyboard and the keyboard mechanism into a testing relationship and thereafter removal of said relationship whereby the keyboard is permitted to move to the discharge conveyer means, wherein the testing relationship is achieved by relatively closer physical adjacency than during the normal keyboard travel on the conveyor means and by effecting a positive electrical connection between the keyboard and the keyboard testing mechanism thereby to permit keyboard testing and thereafter the removal of the testing relationship permits relative physical removal and electrical separation of the keyboard from the keyboard testing mechanism, and wherein the relative position of the keyboard and the testing mechanism is controlled by a movable gripper mechanism, such gripper mechanism being physically movable between discreet different heights, and the gripping mechanism being adapted to support the keyboard at the test station, including stop means for stopping travel of a keyboard along the conveyor system upstream of the keyboard test mechanism, such that a keyboard being tested is separated from the upstream keyboard, wherein the stop means includes means for engaging frictionally the keyboard adjacent to the keyboard side and thereby effect such stopping action, wherein the gripper mechanism includes a substantially T-piece mechanism, the main limb of the T-piece being vertically disposed and the cross limb of the T-piece being substantially horizontally disposed, and pneumatic means for raising and lowering the T-piece gripping mechanism, wherein the cross-limb of the T-piece provides as its leading end, barrier means against which the keyboard can physically abut and through which electrical contact is established with the keyboard testing mechanism, and pivoted abutting means at the trailing end of the cross-limb of the T-piece such abuttng means being movable between a retracted position over which the keyboard can proceed, and an extended position positively urging the keyboard forwardly against the barrier means at the leading end of the cross-limb.

2. A conveyor system as claimed in claim 1 wherein the T-piece is locatable with the cross limb substantially below a conveying level of the conveyor means in a first position, substantially at the conveying level in a second position, and above the conveying level in a third position at which keyboard testing by the keyboard testing mechanism is effected.

3. A conveyor system as claimed in claim 2 wherein the T-piece is removable and replaceable for different keyboards by withdrawal upwardly through a conveyer transport means.

4. A conveyor system as claimed in claim 3 wherein the means defining the conveyor transport includes two spaced sprocket and chain mechanisms directed substantially along the conveyor length and adapted to move keyboards along its length by engagement with the keyboards.

5. A conveyor system as claimed in claim 4 wherein the spacing between the two substantially parallel chain and sprocket mechanisms is adjustable thereby to receive keyboards of different dimensions, and the relative location of the gripper mechanism between the parallel chain and sprocket mechanisms of the conveyor is relatively laterally adjustable to accommodate different keyboards.

6. A conveyor system as claimed in any one of claims 1 to 5 wherein keyboards passed by the testing mechanism are distinguished from keyboards rejected by the testing mechanism by separation means on the discharge conveyor means for separating the rejected boards from the passed boards.

7. A conveyor system as claimed in claim 6 wherein the separation means directs the rejected boards in a first direction and the passed boards in a second direction along the discharge conveyor means.

8. A conveyor system as claimed in claim 7 wherein the separation means is located on the discharge conveyor means downstream from the gripper mechanism and remote from the test station and includes rejection means for operation between a conveyor chain and sprocket mechanisms.

9. A conveyor system as claimed in claim 8 wherein the rejection means includes lifting means physically locatable in at least three different positions, said positions including a first position below the conveying level, a second position for stopping the keyboard travel along the discharge conveyer means, and a third position to lift the keyboard above the conveying level and direct the keyboard in said first direction.

10. A conveyor system as claimed in claim 9 wherein the rejection means includes roller means disposable substantially vertically in the conveying path, said roller means being substantially free running on a vertical shaft, a substantially horizontally located roller obliquely positioned relative to the direction of travel for passed keyboards along the conveyor means, said horizontal roller being operable by motor means, and wheel stabilizer means located upstream of the roller and the vertical free-running roller means for stabilization of the keyboard during the direction change.

11. A conveyor system as claimed in claim 10 wherein the discharge conveyor means includes a laterally directed reject conveyor means located at substantially right angles to the passed discharge direction feed, said right angularly directed conveyor means being for receiving rejected keyboards, the feed to the right angularly directed conveyor including rollers driven by motor means, whereby the activation of the rollers completes the turn of the keyboard to be turned from the passed discharge conveyor means to the reject discharge conveyor means, the leading end of the keyboard abutting against the vertical free running roller, and the trailing end of the keyboard being stabilized on the wheel stabilizer means thereby to effect a smooth discharge of the keyboard onto the reject discharge conveyor means, 12. A conveyor system as claimed in claim 11 including sensor means to determine the relative location of the keyboards on the passed discharge conveyor means and the reject discharge conveyor means thereby to permit regulation of the feed of keyboards on the feed conveyor means and from the keyboard testing station.

13. A conveyor system as claimed in claim 12 wherein the rejection means is removable and replaceable with different rejection means for different keyboards travelling on the conveyor, such rejection means being removable by vertical displacement through the discharge conveyor means.

14. Separation apparatus for a conveyor system for elements comprising lifting means physically locatable in at least three different positions relative to a conveying level of the conveyor system, said positions including a first positon below the conveying level, a second position for stopping the elements travel along the conveyor system, and a third position to lift the elements above the conveying level and direct the elements in a first direction, said direction being different from the normal conveyor direction for the elements, including roller means disposable substantially vertically in the conveying path, said roller means being substantially free running on a vertical shaft, a substantially horizontally located roller obliquely positioned relative to the direction of travel for elements in the normal conveyor direction along a conveyor means, said horizontal roller being operable by motor means, and wheel stabilizer means located upstream of the roller and the vertical free-running roller means for stabilization of the elements during the direction change.

15. The separation apparatus as claimed in claim 14 wherein the conveyor means also includes a lateral conveyor means located at substantially right angles to the normal direction, said right angularly directed conveyor means being for receiving elements directed in the first direction, the feed to the right angularly directed conveyor including rollers driven by motor means, whereby the activation of the rollers causes the elements to be turned from the normal conveyor means to the conveyor means in the first direction, the leading end of the element abutting against the vertical free running roller means, and the trailing end of the element being stabilized on the wheel stabilizer means thereby to effect a smooth discharge of elements onto the first direction conveyor means.

16. Separation apparatus as claimed in claim 15 wherein the elements being conveyed are keyboards.

17. Gripper apparatus for keyboards passing on a conveyor system and for securing the keyboard to permit testing of the boards comprising a substantially T-piece mechanism, the main limb of the T-piece being substantially vertically disposed and the cross limb of the T-piece being substantially horizontally disposed, and pneumatic means for raising and lowering the T-piece mechanism, wherein the cross-limb of the T-piece provides as its leading end, barrier means against which the keyboard can physically abut and through which electrical contact is established with a keyboard testing mechanism, and pivoted abutting means at the trailing end of the cross-limb of the T-piece such abutting means being movable between a retracted position over which the keyboard can proceed, and an extended position positively urging the keyboard forwardly against the barrier means at the leading end of the cross-limb.

18. Gripper apparatus as claimed in claim 17 wherein the T-piece is locatable with the cross limb substantially below a conveying level of the conveyor means in a first position, substantially at the conveying level in a second position, and above the conveying level in a third position at which keyboard testing by the keyboard testing mechanism is effected.

19. A method of effecting separation for a conveyor system for elements comprising moving lifting means physically locatable in different positions between a first position below a conveying level allowing elements to pass unhindered, a second position stopping the elements travel along the conveyor system, and a third position lifting the element above the conveying level and directing the element in a first direction different from the normal conveyor direction for the elements, wherein in the stop position the element abuts against roller means disposable substantially vertically in the conveying path, said roller means being substantially free running on a vertical shaft, thereafter in the lifted position a substantially horizontally located roller obliquely positioned relative to the direction of travel for elements in the normal conveyor direction along the conveyor means operates to change the element direction operable by motor means, and wheel stabilizer means located upstream of the roller and the vertical free-running roller means stabilizes the elements during the direction change.

20. The separation method as claimed in claim 19 wherein the change of direction is substantially at right angles to the normal direction.

21. A conveyor system for transporting keyboards for automatic testing by a keyboard testing mechanism comprising feed conveyor means for moving keyboards to a test station where the keyboard can be tested, the keyboard testing mechanism being located at said test station, discharge conveyor means whereby keyboards passed by the keyboard test mechanism are distinquished from keyboards rejected by the keyboard test mechanism, means at said testing station for bringing the keyboard and the keyboard testing mechanism into a testing relationship and thereafter removal of said relationship whereby the keyboard is permitted to move to the discharge conveyor means, wherein the testing relationship is achieved by relatively closer physical adjacency than during the normal keyboard travel on the conveyor means and by effecting a positive electrical connection between the keyboard and the keyboard testing mechanism thereby to permit keyboard testing and thereafter the removal of the testing relationship permits relative physical removal and electrical separation of the keyboard from the keyboard testing mechanism, and wherein the relative position of the keyboard and the testing mechanism is controlled by a movable grippr mechanism, such gripper mechanism being physically movable between discreet different heights, and the gripping mechanism being adapted to support the keyboard at the test station, wherein the gripper mechanism includes a substantially T-piece mechanism, the main limb of the T-piece being vertically disposed and the cross limb of the T-piece being substantially horizontally disposed, and pneumatic means for raising and lowering the T-piece gripping mechanism, wherein the cross-limb of the T-piece provides as its leading end, barrier means against which the keyboard can physically abut and through which electrical contact is established with the keyboard testing mechanism, and pivoted abutting means at the trailing end of the cross-limb of the T-piece such abutting means being movable between a retracted position over which the keyboard can proceed, and an extended position positively urging the keyboard forwardly against the barrier means at the leading end of the cross-limb.

* * * * *